United States Patent [19]

Avicola et al.

[11] 4,187,537
[45] Feb. 5, 1980

[54] FULL-WAVE RECTIFIER
[75] Inventors: Richard Avicola, Addison; George J. Tzakis, Chicago, both of Ill.
[73] Assignee: Zenith Radio Corporation, Glenview, Ill.
[21] Appl. No.: 972,193
[22] Filed: Dec. 21, 1978
[51] Int. Cl.² .......................................... H02M 7/217
[52] U.S. Cl. .................................... 363/127; 307/260; 324/119; 328/26; 330/69
[58] Field of Search ................ 307/260, 261; 324/119; 328/26; 330/69; 363/125, 127

[56] References Cited
U.S. PATENT DOCUMENTS 3,419,787 12/1968 Baehre .................................. 363/127
3,617,855 11/1971 Hisatsu .............................. 324/119 X
4,053,796 10/1977 van de Plassche .................. 307/261

Primary Examiner—William M. Shoop

[57] ABSTRACT

A full-wave rectifier is disclosed for rectifying low level A.C. input signals. In the disclosed embodiment, the rectifier includes first and second differential amplifiers, each constructed of a pair of transistors. One transistor in each pair of transistors has a D.C. operating point offset from that of the other transistor so that the offset transistor conducts only on an excursion of a given polarity of a received A.C. input signal. Both output currents of the offset transistors are coupled to a load, across which a fully-rectified version of the A.C. input signal is developed.

9 Claims, 6 Drawing Figures

FULL-WAVE RECTIFIER

BACKGROUND OF THE INVENTION

The invention is directed to electronic circuits for receiving an A.C. signal and for duly rectifying that signal.

Conventional full-wave rectifiers are normally constructed with diodes and arranged, for example, in a so-called "bridge" circuit for developing a fully rectified version of an A.C. input signal. Such rectifiers are frequently used in power supplies for rectifying the A.C. line voltage.

For certain applications, particularly where the signal to be rectified has a small amplitude and it is desirable to develop a rectified but otherwise linear output, diode rectifiers are unsuitable because of their inherent non-linearity. In addition, diode rectifiers require complimentary inputs (two A.C. inputs of the opposite polarity), thus adding to the cost of the system. Moreover, in applications where it is desirable to vary the gain of the rectifier, diode rectifiers are unsuitable because they are incapable of providing that function.

In many applications it is also desirable that the rectifier be capable of fabrication with integrated circuit technology. Temperature stability and repeatable performance characteristics become of paramount importance in such instances. However, diode rectifiers and other conventional rectifiers are generally incapable of completely satisfying all these requirements, particularly where "small signal" rectification is required.

Furthermore, it is advantageous in some applications to utilize a full-wave rectifier capable of receiving either or both polarities of an input signal and providing rectified outputs of either or both polarities. Conventional rectifiers are generally incapable of providing this function without further complicating their structure. Accordingly, prior rectifiers have been, to a large extent, somewhat unsuitable for use in a variety of "small signal" applications.

OBJECTS OF THE INVENTION

It is a general object of the invention to provide an improved full-wave rectifier.

It is a more specific object of the invention to provide a rectifier capable of fully rectifying small amplitude signals without distortion.

It is another object of the invention to provide a full-wave rectifier which exhibits stable temperature characteristics, repeatable performance, and is suitable for fabrication with integrated circuit technology.

It is a further object of the invention to provide a full-wave rectifier whose gain is readily varied.

It is another object of the invention to provide a rectifier capable of receiving either or both polarities of an input signal and developing a fully rectified output of either or both polarities.

BRIEF DESCRIPTION OF THE FIGURES

The objects stated above and other objects of the invention are more particularly set forth in the following detailed description and in the accompanying drawings of which.

SUMMARY OF THE INVENTION

Broadly stated, a full-wave rectifier is disclosed which includes two differential amplifiers, each having a pair of amplifiers receiving current from a current source, with one of the amplifiers of each differential amplifier having a D.C. operating point offset from that of the other amplifier such that the offset amplifier conducts only on an excursion of a given polarity of a received A.C. input signal. By coupling the current developed by each offset amplifier to a load, a fully rectified version of the A.C. input signal is developed across the load.

In a preferred embodiment, the amplifiers in each differential amplifier are transistor amplifiers, and the D.C. offset is developed by including a resistance in the emitter circuit of the transistor amplifiers which are to have the D.C. offset. Consequently, degeneration in the offset transistor amplifiers is effected and their range of linear amplification is increased.

DESCRIPTION OF THE PREFERRED EMBODIMENT

Figure 1:
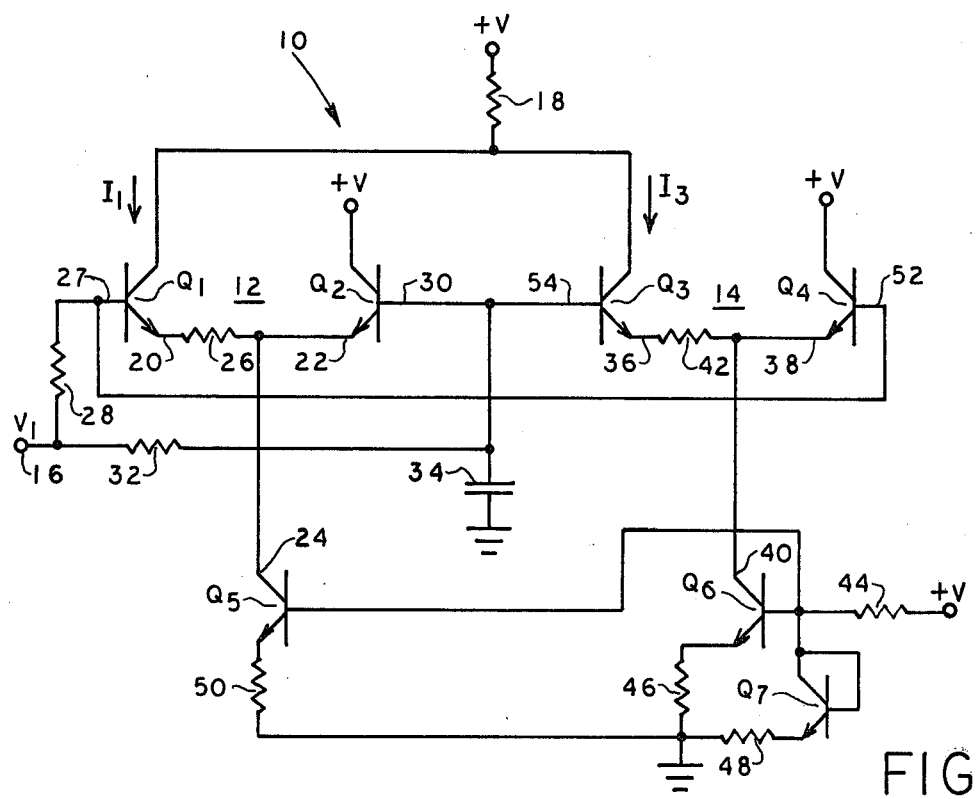
FIG. 1 illustrates a full-wave rectifier according to the invention.

Referring to FIG. 1, there is shown a preferred embodiment of a full wave rectifier 10 embodying various aspects of the invention. The major components of the rectifier 10 include a first differential amplifier means 12 and a second differential amplifier means 14, each of which receive an A.C. input signal $V_1$ from an input terminal 16 for developing a fully rectified version of the A.C. input signal across a load such as resistor 18.

In the illustrated embodiment, the first differential amplifier 12 comprises first and second amplifiers in the form of transistors $Q_1$ and $Q_2$, respectively. The transistors $Q_1$ and $Q_2$ share current from a common current source transistor $Q_5$ by virtue of their emitter terminals 20 and 22 being coupled to the collector terminal 24 of the transistor $Q_5$. For reasons set forth in more detail hereinafter, a resistor 26 is connected in the current path between the emitter terminal 20 of the transistor $Q_1$ and the collector terminal 24 of the source $Q_5$ to offset the D.C. operating point of the transistor $Q_1$ with respect to the D.C. operating point of the transistor $Q_2$.

Figure 2:
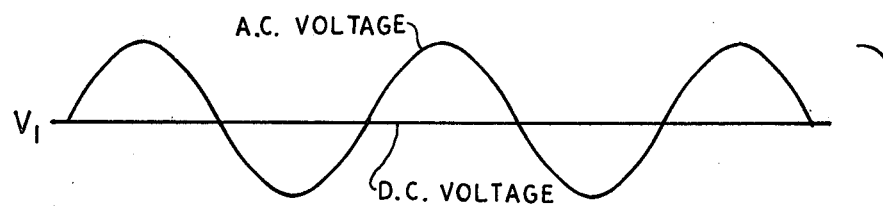
FIG. 2 illustrates certain waveforms useful in describing the operation of the rectifier of FIG. 1.
Figure 2:
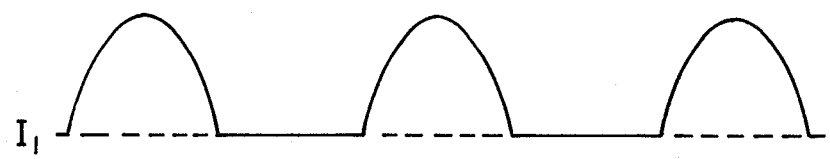
Figure 2:
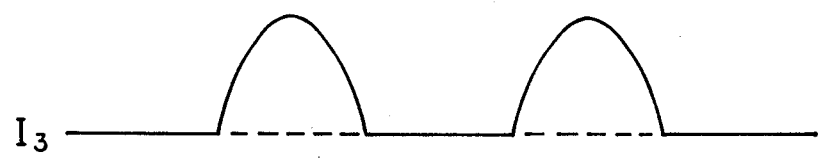

To receive the input signal $V_1$, the base terminal 27 of the transistor $Q_1$ is coupled to the input terminal 16 via a resistor 28. Such coupling enables the transistor $Q_1$ to receive its D.C. base bias from a D.C. voltage on which the input signal $V_1$ may be superimposed, as shown in FIG. 2. The transistor $Q_2$ receives the same D.C. voltage at its base terminal 30 by virtue of its coupling to the input terminal 16 through a resistor 32, preferably of the same value as resistor 28. However, the A.C. component of the signal at terminal 16 is bypassed from the base terminal 30 of transistor $Q_2$ by a capacitor 34.

The output of the first differential amplifier 12 is the collector current I from the transistor $Q_1$. The load resistor 18 is coupled to the collector terminal of the transistor $Q_1$ to convert the current I to a corresponding voltage. In other embodiments, the collector current of the transistor $Q_2$ may be utilized to generate an output which is substantially complimentary to that generated by the transistor $Q_1$.

The second differential amplifier means 14 is constructed similarly to the first differential amplifier means 12 to provide a balanced output. Specifically, the differential amplifier 14 also includes first and second amplifiers in the form of transistors $Q_3$ and $Q_4$, respectively, which share current from a common current source transistor $Q_6$ by virtue of the illustrated coupling between the emitter terminals 36 and 38 of the transistors $Q_3$ and $Q_4$ and the collector terminal 40 of the transistor $Q_6$. In addition, a resistor 42 is disposed in the current path between the emitter terminal 36 and the collector terminal 40 to offset to D.C. operating point of the transistor $Q_3$ with respect to that of the transistor $Q_4$.

To control the amount of current supplied by the source transistor $Q_6$, the base terminal thereof is coupled via a resistor 44 to a voltage source $+V$ and to the collector of a diode-connected transistor $Q_7$. The emitters of the transistors $Q_6$ and $Q_7$ are both grounded through resistors 46 and 48. With this arrangement, the base voltage of the transistor $Q_6$ is determined substantially by the values of the voltage source $+V$ and the resistors 44 and 48, and the base-emitter voltage drop of the transistor $Q_7$. An appropriate level of current to be conducted by the transistor $Q_6$ is achieved by appropriate selection of the value of the resistor 46.

The bias for the transistor source $Q_5$ is preferably provided, as shown, by coupling its base terminal to the base terminal of the transistor $Q_6$. Substantially the same level of current is supplied by the transistors $Q_5$ and $Q_6$ by providing an emitter resistor 50 for the transistor $Q_5$ of the same value as the resistor 46.

The input signal $V_1$ is coupled to the differential amplifier 14 by coupling the base terminal 52 of the transistor $Q_4$ to the base terminal 27 of the transistor $Q_1$. Hence, the D.C. component as well as the A.C. component of the signal at the base terminal 27 of transistor $Q_1$ is also present at the base terminal 52 of the transistor $Q_4$.

Bias to the base terminal 54 of the transistor $Q_3$ is provided by a direct connection, as shown, between the base terminals of the transistors $Q_2$ and $Q_3$. Because of the presence of the capacitor 34, the base terminal of the transistor $Q_3$ is bypassed as to A.C. signals. With this arrangement, the transistors $Q_1$ through $Q_4$ each receive substantially the same D.C. bias voltage from the input signal $V_1$ while only the transistors $Q_1$ and $Q_4$ receive the A.C. component of the input signal $V_1$. This circuit configuration, along with the effect which the emitter resistors 26 and 42 produce, enables the rectifier 10 to develop across the load resistor 18 a fully rectified version of the A.C. input signal without simultaneously developing a substantial D.C. component across the load. The way in which the rectification takes place will be described after first explaining more fully the function of the emitter resistors 26 and 42.

Figure 3:
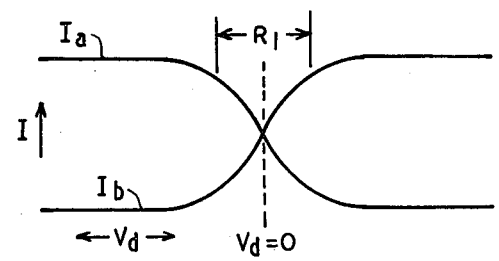
FIG. 3 shows the operating characteristics of a conventional two-transistor differential amplifier, for comparison with the characteristics of a modified differential amplifier utilized in the rectifier of FIG. 1.

Referring now to FIG. 3, a pair of curves are shown which illustrate the relationship between current and differential base-emitter voltage ($V_d$) of a conventional two-transistor differential amplifier. As indicated, when the base-emitter voltages of the two transistors are identical ($V_d=0$), the current $I_a$ of one transistor is equal to the current $I_b$ of the other transistor. That is, at the point where $V_d$ equals zero, both transistors conduct equally and amplify substantially linearly, assuming that they are not overdriven. Additionally, both transistors amplify linearly over the range $R_1$ for small signal inputs. Typically, the range $R_1$ is about 100 millivolts.

Figure 4:
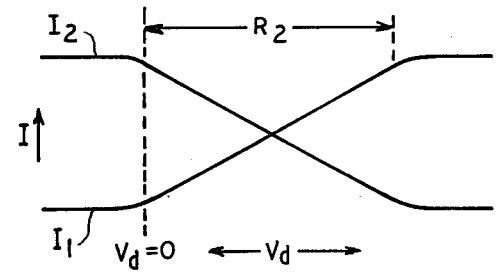
FIG. 4 shows the operating characteristics of a differential amplifier utilized in the rectifier of FIG. 1.

The effect of including the resistors 26 and 42 in the emitters of the transistors $Q_1$ and $Q_3$ is shown graphically in FIG. 4 which illustrates current versus differential base-emitter voltage curves for the transistors $Q_1$ and $Q_2$. As shown, because the emitter circuit transistor $Q_1$ includes the resistor 26, the D.C. operating point of the transistor $Q_1$ is offset from the D.C. operating point of the transistor $Q_2$ such that the quiescent current $I_1$ (at $V_d=0$) associated with the transistor $Q_1$ is very small compared to the current $I_2$ of transistor $Q_2$. In other words, when no A.C. signal is received at the base terminal of the transistor $Q_1$, that transistor is barely conducting. In fact, when the resistor 26 is approximately 450 ohms and the current delivered by the source $Q_5$ is approximately 4 ma, the current $I_1$ is about 20 times smaller than the current $I_2$. The absolute value of the current $I_1$ depends, of course, on the level of current supplied by the transistor source $Q_5$ and the value of resistor 26. This absolute value of the current $I_1$ can be expressed in terms of the desired ratio of the currents $I_1$ and $I_2$ and the value of the resistor 26 as $$I_1 = [.03 \ln \frac{(I_2)}{(I_1)}] \div R26.$$

The absolute value of the current $I_1$ can also be expressed in terms of the value of the currents supplied by the source $Q_5$, the value of the resistor R26 and the magnitude of the current $I_2$ as $$I_1 = [.03 \ln \frac{(I_2)}{(I_5 - I_2)}] \div R26.$$

When the A.C. signal received by the transistor $Q_1$ undergoes a negative excursion (i.e., below the level of the D.C. voltage on which it is superimposed), the transistor $Q_1$ is turned off. When the A.C. signal undergoes a positive excursion above the level of the D.C. voltage on which it is superimposed, the transistor $Q_1$ conducts and linearly amplifies the A.C. input signal. This effect, shown in FIG. 2, results in relative large $I_1$ whenever the A.C. input signal is positive (above the D.C. voltage level) and zero $I_1$ whenever the A.C. input signal is negative.

The transistors $Q_3$ and $Q_4$ operate similarly to the transistors $Q_1$ and $Q_2$. That is, the D.C. operating point of the transistor $Q_3$ is offset from the D.C. operating point of the transistor $Q_4$ so that, as shown in FIG. 2, the transistor $Q_3$ produces a current $I_3$ only for negative excursions of the A.C. input signal. When the current $I_1$ and $I_3$ are summed in the load resistor 18, a fully rectified version of the A.C. input signal is developed.

As will now be explained, the resistors 26 and 42 not only offset the D.C. operating point of the transistors $Q_1$ and $Q_3$, but they also degenerate the gain of those transistors so as to extend their range of linear amplification. This effect is also shown in FIG. 4 where the range of linear amplification R2 is substantially greater than the corresponding range R1 of FIG. 3 in which no degeneration is effected. As a result, the full-wave rectifier 10 is capable of linearly amplifying a larger A.C. input signal than would otherwise be possible.

Figure 5:
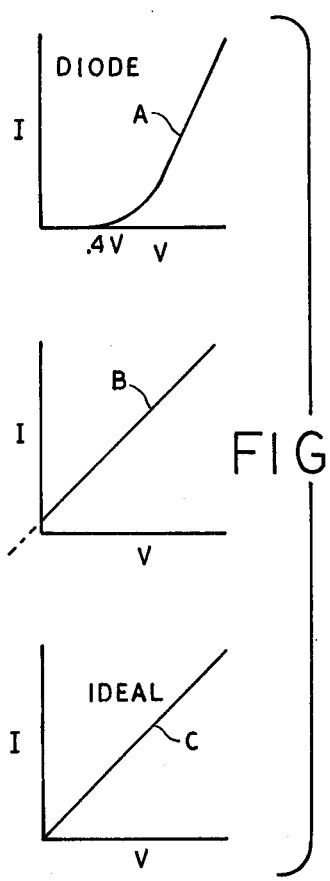
FIG. 5 depicts current versus voltage curves of a diode rectifier, a rectifier utilized in FIG. 1, and an ideal rectifier for purposes of comparison.

As stated above, the transistors $Q_1$ and $Q_3$ conduct substantially linearly immediately as the A.C. input signal undergoes positive and negative excursions. This effect is shown graphically in FIG. 5 wherein the curve B illustrates linear amplification by the transistor $Q_1$ when the base voltage V of transistor $Q_1$ goes positive with respect to the base voltage of the transistor $Q_2$. The transistor $Q_3$ operates similarly.

An ideal voltage versus current source is shown as curve C. Note that the only difference between the curves B and C is that, in curve B, a slight current exists when V equals zero. This preferred linear operation contrasts sharply with that of conventional diode rectifiers which exhibit substantial non-linearity. As shown by curve A of FIG. 5, a diode is substantially non-conductive until its anode-to-cathode voltage reaches about four tenths of a volt. In that region of operation, the diode current is quite non-linear. Hence, for small signal operation (input voltage having an amplitude of under several volts), a diode rectifier is incapable of generating a current which corresponds linearly to its input voltage, in contrast to the linear operation of the full-wave rectifier 10.

Another advantage of the full-wave rectifier 10 which has been briefly mentioned above is that the output developed across the load resistor 18 is substantially free of a D.C. component. That desirable result is obtained because, as shown by curve B of FIG. 5, the output current of each of the transistors $Q_1$ and $Q_3$ is very small when its received voltage is not of the polarity on which that particular transistor is designed to conduct. Ideally, transistor $Q_1$ would not conduct at all until the A.C. input signal goes positive, and the transistor $Q_3$ would remain off until the A.C. input signal goes negative. This ideal characteristic is shown by curve C of FIG. 5.

Figure 6:
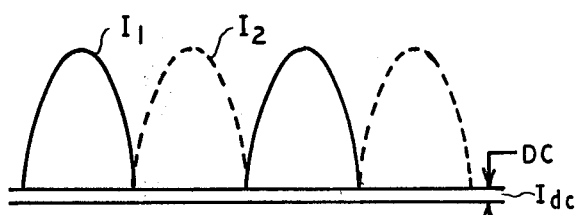
FIG. 6 shows the output developed by the rectifier of FIG. 1.

As a consequence of the very small D.C. current generated by the transistors $Q_1$ and $Q_3$, the output voltage developed across the load resistor 18 is as shown in FIG. 6. As illustrated, that output voltage is a function of the A.C. current $I_1$ (solid lines), the A.C. current $I_2$ (dashed lines), and the small D.C. component $I_{dc}$ (shown exaggerated in FIG. 6 for clarity) generated by the transistors $Q_1$ and $Q_3$. Because that D.C. component is very small, the voltage across the load resistor 18 may be coupled directly (D.C. coupled) to further signal processing stages. This is particularly advantageous where the full-wave rectifier 10 and one or more further stages of signal processing are fabricated on a single integrated circuit chip because the need for a large coupling capacitor between the resistor 18 and the further stages of signal processing is eliminated.

Another advantage provided by the full-wave rectifier 10 is that it exhibits very stable temperature characteristics as is inherent in differential amplifiers. Further, it is particularly adaptable for fabrication on an integrated circuit chip to provide stable, repeatable performance. This latter effect is because the transistors and resistors may be well matched on an integrated circuit, and their temperature characteristics "track" with one another.

In applications where it is desirable to vary the amplitude of the rectified output signal, that effect is provided simply by adding a differential amplifier in cascade with the collectors of the transistors $Q_1$ and $Q_3$ and by varying the differential voltage applied to the base terminals of the cascade amplifier. A gain controlled output signal is obtained at the collector of either transistor in the cascade amplifier.

Other variations in the full-wave rectifier 10 may also be made. For example, some resistance may be included in the emitters of the transistors $Q_2$ and $Q_4$ as long as those transistors remain substantially non-degenerated relative to the degeneration provided by the resistors 26 and 42. That is, the important effect is to achieve operating characteristics similar to those shown in FIG. 4.

Because of its linear rectification, the full-wave rectifier 10 is very useful in applications where it is necessary to develop the absolute value of a signal. For example, in certain image enhancement systems, it is useful to generate the absolute value of the derivative of a video signal. If the A.C. input of signal $V_1$ of FIG. 1 corresponds to the derivative of the video signal, the output signal across the load resistor 18 corresponds to the absolute value of the input signal. Other applications, such as for use in doubly-balanced demodulators, will also be apparent to those skilled in the art. Moreover, in situations where it is desirable to generate complimentary rectified outputs, the currents developed by the transistors $Q_2$ and $Q_4$ may be utilized in addition to the currents developed by the transistors $Q_1$ and $Q_3$.

Although the invention has been described in terms of a preferred embodiment, it will be obvious to those skilled in the art that many alterations and modifications to the preferred embodiment may be made without departing from the invention. Some such modifications have already been mentioned. Other modifications could include, by way of example only, utilizing different types of current sources for the differential amplifiers. Accordingly, it is intended that all such modifications and alterations be included within the spirit and scope of the invention as defined by the appended claims.

What is claimed is:

1. A full-wave rectifier, comprising:

first differential amplifier means adapted to receive an A.C. input signal and having first and second amplifiers sharing current from a common current source, said first amplifier having a D.C. operating point substantially offset from that of said second amplifier such that said first amplifier conducts substantially only on positive excursions of the A.C. input signal;

second differential amplifier means adapted to receive the A.C. input signal and having first and second amplifiers sharing current from a common current source, said first amplifier in said second differential amplifier means having a D.C. operating point substantially offset from that of said second amplifier in said second differential amplifier means such that said first amplifier in said second differential amplifier means conducts substantially only on negative excursions of the A.C. input signal;

a load impedance; and means coupling the current conducted by the first amplifiers of said first and second differential amplifier means to said load impedance, whereby a fully rectified version of the A.C. input signal is developed across said load impedance.

2. A full-wave rectifier as set forth in claim 1 wherein all amplifiers in said first and second differential amplifier means comprise transistor amplifiers, and including an impedance coupled between the emitter of each of said first amplifiers and their current sources, thereby establishing the D.C. offset in operating points.

3. A full-wave rectifier as set forth in claim 2 wherein the first amplifier in said first differential amplifier means receives the A.C. input signal and wherein the second amplifier in said second differential amplifier means receives the A.C. input signal.

4. A full wave rectifier as set forth in claim 2 wherein the A.C. input signal is superimposed on a D.C. voltage, and including means for coupling the D.C. voltage to the inputs of each differential amplifier, whereby both differential amplifiers are adapted to change their conduction as the A.C. input signal rises above and below the D.C. voltage.

5. A full-wave rectifier, comprising:
a first degenerated transistor amplifier and a first non-degenerated transistor amplifier coupled together in a differential amplifier configuration, said first degenerated D.C. amplifier receiving an A.C. input signal and having an output terminal;
a second degenerated transistor amplifier and a second non-degenerated transistor amplifier coupled together in a differential amplifier configuration, said second non-degenerated transistor amplifier receiving the A.C. input signal and said second degenerated transistor amplifier having an output terminal;
a load impedance; and
means for coupling the load impedance to said output terminals,
whereby the first degenerated transistor amplifier conducts substantially only on positive excursions of the A.C. input signal and the second degenerated transistor amplifier conducts substantially only on negative excursions of the A.C. signal to develop a fully rectified version of the A.C. input signal across said load impedance without introducing a substantial D.C. voltage across said load impedance.

6. A full-wave rectifier as set forth in claim 5 wherein both differential amplifiers are coupled to respective current sources, and wherein each of said first and second degenerated transistor amplifiers has an impedance coupled between its emitter and its current source to provide degeneration.

7. A full-wave rectifier as set forth in claim 6 wherein the impedance associated with each degenerated transistor amplifier are substantially equal and of a value to cause said degenerated transistor amplifiers to be substantially less conductive than said non-degenerated transistor amplifiers in the absence of an A.C. input signal.

8. A full-wave rectifier as set forth in claim 7 wherein the A.C. input signal is superimposed on a D.C. voltage, and including means for coupling the D.C. voltage to the inputs of each transistor amplifier, whereby both differential amplifiers are adapted to change their conduction as the A.C. input signal rises above and below the D.C. voltage.

9. A full-wave rectifier, comprising:
first and second transistor amplifiers having base, emitter and collector terminals and coupled together in a differential amplifier configuration;
a first current source feeding current to said first and second transistor amplifiers;
an impedance coupled between the emitter terminal of said first transistor amplifier and said first current source for substantially lowering the D.C. operating point of said first transistor amplifier with respect to said second transistor amplifier;
means coupling an A.C. input signal and a D.C. bias voltage to the base terminal of said first transistor amplifier;
third and fourth transistor amplifiers having base, emitter, and collector terminals and coupled together in a differential amplifier configuration;
a second current source feeding current to said third and fourth transistor amplifiers;
an impedance coupled between the emitter terminal of said third transistor amplifier and said second current source for substantially lowering the D.C. operating point of said third transistor amplifier with respect to said fourth transistor amplifier;
means coupling the A.C. input signal and the D.C. bias voltage to the base terminal of said fourth transistor amplifier;
means coupling the base terminal of the second transistor amplifier to the base terminal of the third transistor amplifier and to the D.C. bias voltage; and
a load coupled to the collector terminals of said first and third transistor amplifiers,
whereby the first and third transistor amplifiers conduct substantially only on the positive and negative excursions, respectively, of the A.C. input signal for developing a fully rectified version of the A.C. input signal across the load without developing a substantial D.C. voltage across the load.

* * * * *